United States Patent [19]

Yamamura

[11] Patent Number: 5,295,164
[45] Date of Patent: Mar. 15, 1994

[54] APPARATUS FOR PROVIDING A SYSTEM CLOCK LOCKED TO AN EXTERNAL CLOCK OVER A WIDE RANGE OF FREQUENCIES

[75] Inventor: Michael Yamamura, Los Gatos, Calif.

[73] Assignee: Apple Computer, Inc., Cupertino, Calif.

[21] Appl. No.: 816,394

[22] Filed: Dec. 23, 1991

[51] Int. Cl.[5] .................................................. H03D 3/24
[52] U.S. Cl. ..................................... 375/120; 328/155; 307/262
[58] Field of Search .................. 375/81, 120; 328/155, 328/133, 134; 307/262, 525, 511, 527

[56] References Cited

U.S. PATENT DOCUMENTS 4,789,996  12/1988  Butcher ........................... 375/120 X
5,079,519   1/1992  Ashby et al. ..................... 375/120 X

*Primary Examiner*—Curtis Kuntz
*Assistant Examiner*—Tesfaldet Bocure
*Attorney, Agent, or Firm*—Blakely, Sokoloff, Taylor & Zafman

[57] ABSTRACT

A digital phase lock loop circuit for synchronizing the phase of clock signals delivered to devices through clock tree circuitry with the phase of input clock signals including a first delay line, a second delay line, a phase detector circuit, apparatus for transferring the input clock signals through the first delay line to the phase detector circuit, apparatus for transferring the input clock signals through the second delay line and the clock tree circuitry to the phase detector circuit, apparatus responsive to the difference in phase detected between the clock signals transferred through the first and second delay lines for varying the delay of one of the delay lines to bring the clock signals transferred through the first and second delay lines into phase with one another.

9 Claims, 3 Drawing Sheets

APPARATUS FOR PROVIDING A SYSTEM CLOCK LOCKED TO AN EXTERNAL CLOCK OVER A WIDE RANGE OF FREQUENCIES

BACKGROUND OF THE INVENTION

1. Field of the Invention

This invention relates to circuitry for locking internally-generated system clock signals of a computer system to function with externally-provided clock signals and, more particularly, to methods and apparatus for locking internally-generated clock signals to function with externally-provided clock signals which may vary over an extremely wide range of frequencies.

2. History of the Prior Art

When a computer system functions with an external peripheral device, it must utilize data provided by that external device. In order to use that data, it must receive not only the data but the clock signal which is used to distinguish the elements of the data signal train one from another. To derive meaning from the elements of the data signal train, a computer generates internal clock signals at the same frequency as the clock frequency of the peripheral device supplying the data. If each pulse of the internal clock train begins and ends at the same time as do the pulses of the external clock train, the data signals may be properly interpreted.

However, because the substrates of the integrated circuits upon which circuit elements are placed differ, because the circuits operate in different environments, and because the distances conductors must traverse from the source of the clock signals to the devices using the clock signals differ and exhibit different resistance and capacitance, the internal clock signals so generated may start and end at different points in time than do the external clock signals. Basically, the circuitry through which the clock signals are distributed to the circuit elements provides undesirable delay which causes the internal clock signals to reach the circuit elements delayed by some time. In order to make sure that the clock signals reach all of the elements which they affect at essentially the same time, the conductors carrying the clock signals are made, as nearly as possible, to have the same length. The typical manner in which this is accomplished is by branching the circuitry like a tree from the original source of the clock signals to the devices using the clock signals. Consequently, such circuitry is often referred to as a clock tree.

Thus, the internal clock signals generated from external clock signals are delayed (exhibit clock skew). When clock frequencies become very high so that the time during which data signals are present is quite short, clock skew becomes very significant. To eliminate clock skew, a typical computer will, therefore, sample the incoming clock signals and provide internal system clock signals the pulses of which are phase-locked (when measured at the devices using the clock signals) to the external clock signals. In this manner, both the peripheral device and the system operate at the same clock frequency so the externally provided data signals mean the same thing to the system as they do to the peripheral device.

Normally, this is not too difficult to accomplish. However, modern desktop computers are being designed as so-called "multimedia" stations in which television, stereophonic sound, and many other sources are all to be used to provide input signals. The requirement that a computer system operate with television and real time signals tends to force the internal frequency of the system to be quite high so that it can handle the copious amounts of information presented in those media. Many of the peripheral devices used for such multimedia functions themselves operate at quite high clock frequencies. On the other hand, many useful and proven peripheral devices function at much lower clock frequencies. Thus, a modern computer may have input signals arriving from peripheral devices which function on clock signals which vary from one megahertz to fifty megahertz. Providing internal system clock signals for such a range of frequencies and locking those internal clock signals to all of the external clocks over such a wide range creates a monumental problem.

For example, in order to assure that a peripheral device and a system operate on the same clock signals, a phase-locked loop circuit is normally provided. This circuitry may be analog or digital in nature, but the preference is for a digital circuit which can be placed in the same integrated circuit with other circuits and may conceivably use standard circuit layouts. To create a digital phase-locked loop circuit to synchronize the pulses of internal clock signals to external clock signals, circuitry of some sort for providing a delay must be used. Typically this circuitry provides a single delay line that generates a delay which when added to the clock skew delay equals one cycle of clock operation. The clock skew delay tends to be only a small part of the total clock period so that the internal clock signals actually operate approximately one full cycle behind the external clock signals. The phase of the signals provided through the delay line and the clock tree is compared at the device using the signal to the phase of the original clock signals, and the delay is adjusted to make the phases identical.

In implementing such digital circuitry as an integrated circuit, a string of inverters is typically used to provide the single adjustable delay line. If the delay is very brief as it would be in dealing with external clock signals of fifty megahertz, then the circuitry for providing the delay might utilize a reasonable number of inverter elements such as one thousand. On the other hand, the string of inverters necessary to provide a delay for an external clock signals operating at one megahertz would be fifty times as large. Such a great number of circuit elements will render a delay circuit impractically large and expensive.

SUMMARY OF THE INVENTION

It is, therefore, an object of the present invention to provide digital circuitry capable of generating internal system clocks and locking those clock signals to external clock signals over a very wide range of operating frequencies.

It is another object of the present invention to provide circuitry capable of generating internal system clock signals and locking those clock signals to external clock signals over a very wide range of operating frequencies utilizing significantly less circuitry than the typical prior art circuit.

These and other objects of the present invention are realized in a digital phase lock loop circuit for synchronizing the phase of clock signals delivered to devices through clock tree circuitry with the phase of (external) input clock signals comprising a first delay line, a second delay line, a phase detector circuit, means for transferring the input clock signals through the first delay line to the phase detector circuit, means for transferring the input clock signals through the second delay line and the clock tree circuitry to the phase detector circuit, means responsive to the difference in phase detected between the clock signals transferred through the first and second delay lines for varying the delay of one of the delay lines to bring the clock signals transferred through the first and second delay lines into phase with one another.

These and other objects and features of the invention will be better understood by reference to the detailed description which follows taken together with the drawings in which like elements are referred to by like designations throughout the several views.

DETAILED DESCRIPTION OF THE INVENTION

Figure 1:
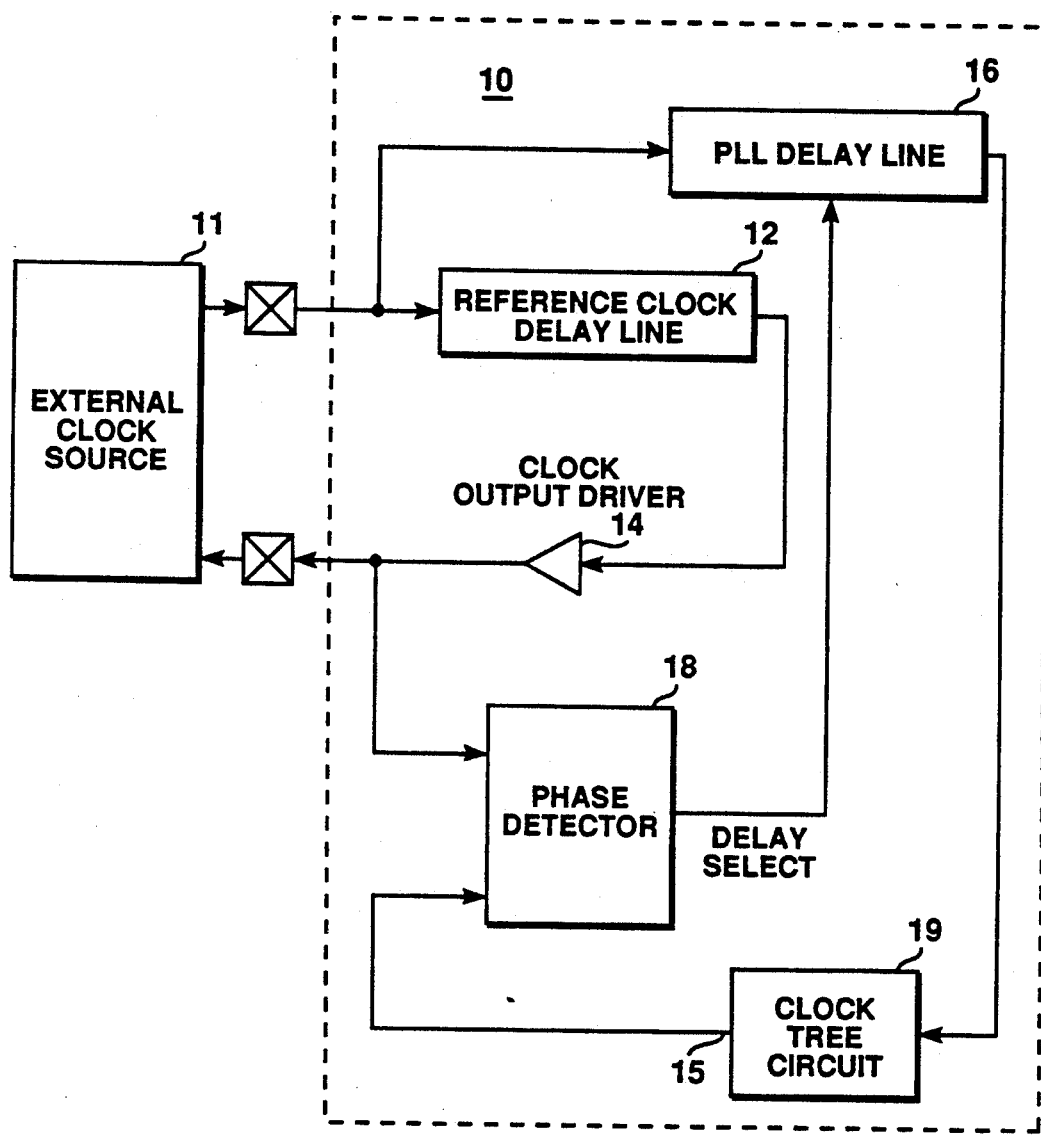
FIG. 1 is a block diagram illustrating a first embodiment of the invention.

Referring now to FIG. 1, there is illustrated in block form a circuit 10 in accordance with the present invention. The circuit 10 receives input clock signals from a source 11 of clock signals. The source 11 of clock signals may be a peripheral device used with a computer system or a portion of the system which is to be locked to some particular operating frequency of another portion of the system. Typically, the source 11 will be a peripheral device which operates at a clock frequency different than that of the computer system. This external clock signal is the signal which is used as the basis for generating an internal clock signal at an identical frequency which is phase locked at the device end of the clock tree to the external clock signal so that the signals to and from the external source may be correctly interpreted.

The external clock frequency is furnished to a reference clock delay line circuit 12. The reference clock delay line 12 includes a delay line which is selected to provide a known delay. The delay line circuit 12 may be constructed of any of a number of devices well known to the prior art such as a number of inverter stages connected serially to provide a fixed delay independent (essentially) of variation due to the frequency of the input clock signal. The string of clock pulses provided by the circuit 12 is furnished to a clock output driver circuit 14. The clock output driver circuit 14 is essentially circuitry for utilizing the output produced by the reference delay circuit 12 to produce properly formed clock pulses at the same frequency as the external clock frequency; such circuitry is well known to those skilled in the art. The output of the clock output driver circuit 14 is furnished to the peripheral device or other device which is the source of the original clock pulses and constitutes a system clock locked to the input clock from the peripheral device. The system clock may be used to synchronize other system components with the circuit 10.

In order to provide the appropriate phase synchronization of the edges of the system clock signals and the internal clock signals of the circuit 10, a second delay line 16 is provided. This delay line 16 includes a series of individual stages of delay such as inverters which may be controlled to provide a delay just sufficient that the clock signals from the peripheral device sent through the delay line 16 and through clock tree circuitry 19 used for carrying the internal clock signals to the devices using those clock signals arrive at a phase detector circuit 18 exactly in synchronization with the clock signals from the peripheral device through the delay line 12 and the clock output driver 14. In order to measure the delay through the clock tree circuitry 19 precisely, one branch (one conductor) of the actual clock tree is sampled by the phase detector circuit 18 at the point at which a device using the internal clock would normally be positioned (the device end 15 of the clock tree). The clock tree circuit 19 in the figures refers to this conductive branch.

Thus, in contrast to the prior art which uses a single delay line, the present invention utilizes a pair of delay lines, one for each of the signals to be compared. By using these two delay lines, the internal and external clock signals are phase synchronized to be exactly in phase rather than synchronized so that the internal clock signals lag the external clock signals by exactly one clock period as in the prior art.

The delay through the delay line 16 and the clock tree circuitry 19 is made to be equal to the delay provided by the fixed delay line 12 by using the phase detector 18 to adjust the delay of the delay line 16 to have the appropriate value based on the initial difference between the phase of the two clock signals. In a preferred embodiment of the invention, the phase detector includes logic which selects a particular stage of delay from a plurality of selectable stages in the delay line 16 depending upon the phase difference detected by the phase detector. More particularly, the phase detector 18 measures the time between a particular edge of the external clock pulse and the same edge of the clock signal through the delay line 16 and the clock tree circuitry 19 and determines which edge leads and which lags. The length of this time is used to select one of the particular stages of the delay line 16. Various phase detector circuits are well known to the prior art. The details of the construction of a phase detector sensitive to the edges of two signals is described in *The Art of Electronics*, 2d. Edition, Horowitz and Hill, Cambridge Univ. Press, at pp. 644-45.

Thus, the external clock signals are transferred through the reference delay line 12 to the clock output driver 14 where a clock signal delayed by the fixed amount is produced. This signal is identical to the external clock signal except that it is delayed by the fixed delay. Thus, this signal may be transferred back to the peripheral device to provide reference clock signals at that device to which signals may be synchronized. This signal may also used to provide reference clock signals within the system (external to the circuit 10) to which the internally-generated clock signals of circuit 10 are phase locked.

The same external clock signal used to generate the reference clock signals is transferred to the delay line 16 which may be selected to be as long as necessary. This external clock signal delayed by whatever delay is produced at the delay line 16 is transferred through the clock tree circuitry 19. The delay caused by the clock tree circuitry 19, in general that due to the resistance/capacitance delay through the clock tree circuitry, adds to the phase delay of the clock signals through the delay line 16.

The phase of the internal clock signals passing through the clock tree circuitry 19 is compared at the device end of the clock tree 19 with the phase of the reference clock signals at the output of the driver 14 by the phase detector 18 The difference in phase between these two signals provides a value which is used to select the number of stages of inverter delay furnished by the delay line 16 to be used. By varying the number of delay stages of the delay line 16, the phases of the internal and reference clock signals at the phase detector are made identical; and the external and internal clock signals are exactly synchronized.

Figure 3:
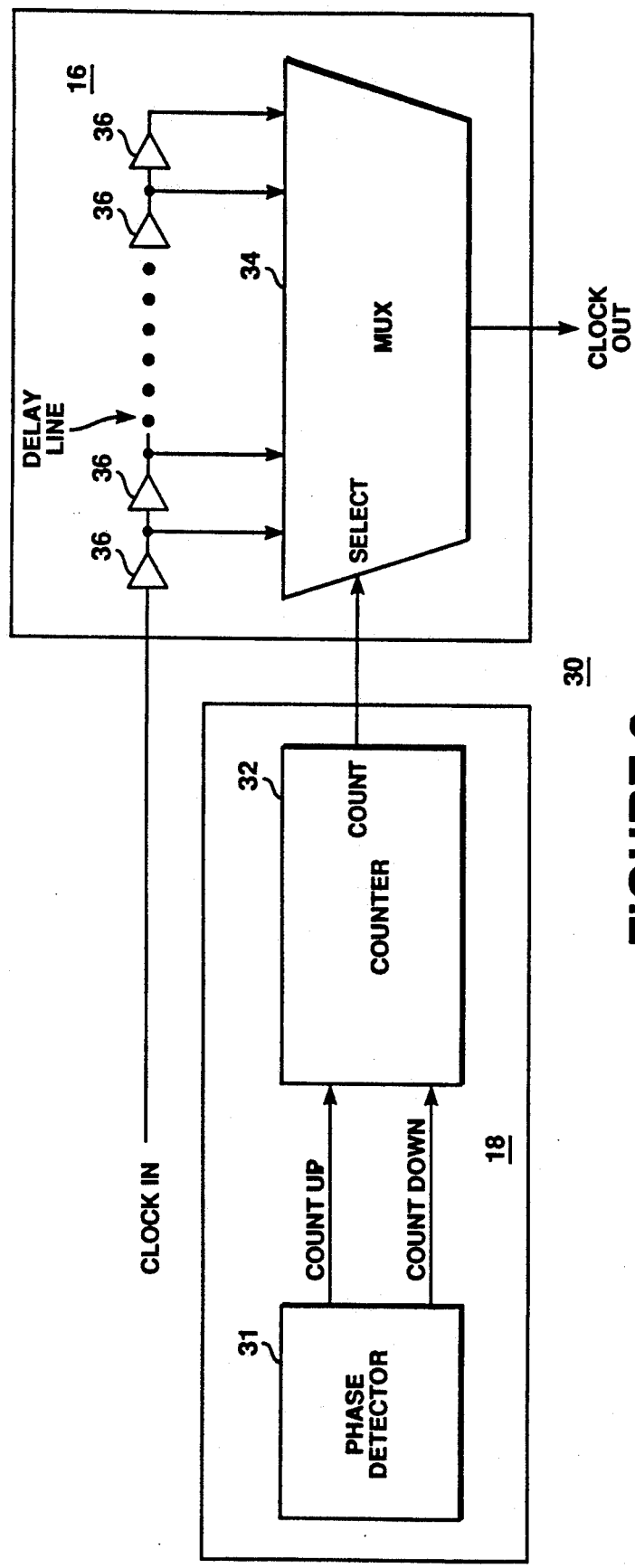
FIG. 3 is a circuit diagram illustrating a number of stages of delay circuitry and circuitry for selecting a particular delay which may be used in the circuits of FIGS. 1 and 2.

FIG. 3 illustrates an arrangement 30 which includes a portion of the output of the phase detector 18 and the delay line 16. The output of the actual phase detecting circuitry (such as the phase detector referred to above) within the circuit 18 is provided to indicate the difference in the phase timing of the two clock signals. The output of the actual phase detector circuit is furnished to a counter 32 which counts up or down during the period of the phase difference. For a longer phase difference, more time is counted; for a shorter phase difference, less time is counted. The counter circuit 32 within the phase detecting circuitry 18 provides an output count to a select terminal of a multiplexor 34 which is a part of and controls the output of the delay line 16. As may be seen, a plurality of stages of delay 36 are provided, and any stage may be selected depending on the particular count provided. In the embodiment illustrated, a pair of inverters are included within each stage of delay 36 to assure the correct polarity of output. Using these stages of delay, the clock signal furnished to the delay line 16 may be selectively varied to provide a clock signal from the delay line 16 which, when it has traversed the path through the clock tree circuitry 19, will be exactly in phase with the output of the clock driver 14.

The circuit illustrated in FIG. 1 offers a number of advantages. First, the phase lock loop circuitry of the present invention does not attempt to provide a delay of one clock period between the external and internal clock signals. Instead, two delay lines are used and the delay through each is balanced so that the signals are exactly in phase. This means that the reference clock delay line 12 need only be long enough that it provides a delay somewhat longer than the delay through the clock tree circuitry at all frequencies which are to be used for clock frequencies by any peripheral device. This difference is then balanced out by the selectable delay line 16 which may be even shorter than the delay line 12. Because the reference clock delay line 12 offers a known delay whatever the frequency of the incoming signals, the difference between the known delay and the clock skew delay for various clock frequencies may be adjusted using the delay line 16. Typically, the delay through the clock tree may be about six nanoseconds. This should be contrasted to the delay of twenty nanoseconds which must be produced by prior art circuits for a clock frequency of fifty megahertz or a delay of one microsecond which must be produced by prior art circuits for a clock frequency of one megahertz. Because of this, both of the delay lines 12 and 16 use many fewer components than might be expected from prior art arrangements. For example, in order to shift the leading edge of a clock pulse by a full clock cycle at a frequency of fifty megahertz, approximately two thousand individual inverter stages are needed. If the frequency of the clock signals of the peripheral device were to be one megahertz rather than fifty megahertz, fifty times as many inverter stages would be required to provide the delay. In a particular circuit in accordance with the invention the number of inverting devices needed for the delay line 16 has (for example) been reduced to a total of approximately 256 devices. This is quite important where a number of individual synchronizing circuits may be required to accomplish the locking of all of the clocks necessary for each of the peripheral devices in a multimedia arrangement. It allows the reduction of individual devices to a conceivable number.

Another substantial advantage of the circuit 10 is that it allows a relatively inexpensive peripheral device operating at a low clock frequency to be used with the system without requiring that the peripheral device have the facility to provide for generating two individual synchronized clock signals. The allows inexpensive peripheral devices to be used thereby increasing the number of peripherals which may be used with the system.

Figure 2:
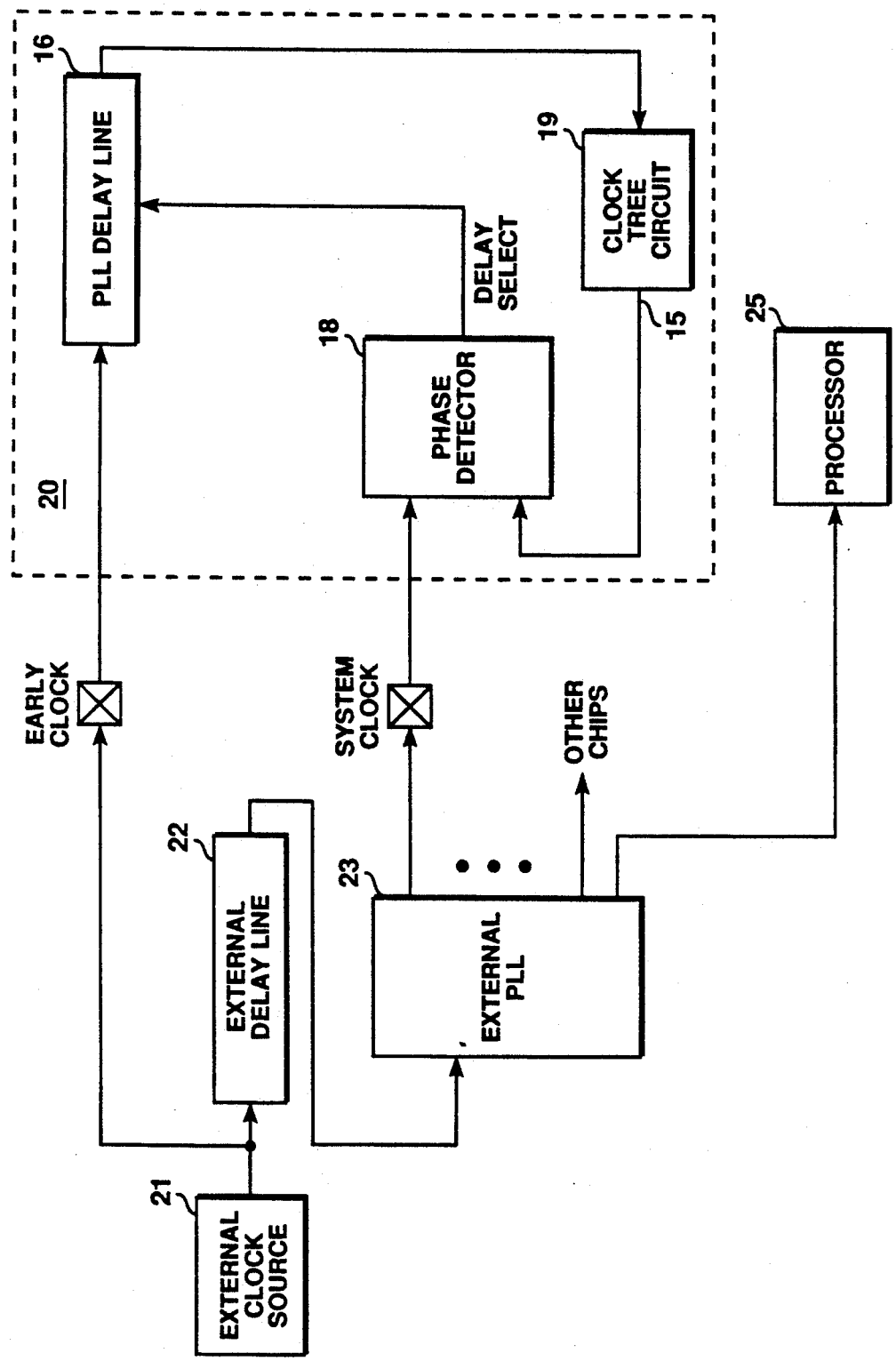
FIG. 2 is a block diagram illustrating a second embodiment of the invention.

FIG. 2 illustrates a second embodiment of the invention. In FIG. 2, a circuit 20 includes the same phase detector 18, selectable delay line 16, and clock tree circuitry 19 as does the circuit of FIG. 1. However, the fixed delay line 12 of the circuit 10 is replaced by a fixed delay line 22 which is external to the circuit 20. The clock signals from the external clock source 21 are furnished to this external delay line 22 and are also provided as an early clock (earlier in phase than that produced by the delay line 22) to the selectable delay line 16. The delay line 22 produces a clock signal for driving an external phase lock loop circuit 23 (which may be of any type known to the prior art or may be of the type described herein) which generates the system reference clock signals. These system reference clock signals may be sent to other chips of the system such as a processor 25 to assure that all components receive the same external clock frequency to which they may synchronize.

The system reference clock signals are sent by the circuit 23 to the phase detector 18 and compared in phase to the internal clock signals at the device end of the clock tree circuitry 19 which have passed through the selectable delay line 16 and the selected branch of the clock tree circuitry 19. The logic of the phase detector 18 selects the delay of the delay line 16 in the manner described with respect to FIG. 1 to equate the phases of the two clock signals. In this manner, the two clock signals are synchronized. As with the circuit of FIG. 1, the circuit 20 also requires a much smaller number of delay devices in both the delay circuit 22 and the selectable delay circuit 16 than would normally be required for the range of clock frequencies which might be available at the peripheral devices.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A digital phase lock loop circuit for synchronizing a phase of clock signals delivered to devices through clock tree circuitry with a phase of input clock signals comprising a first delay line, a second delay line, a phase detector circuit, means for transferring the input clock signals through the first delay line to the phase detector circuit, means for simultaneously transferring the input clock signals through the second delay line and the clock tree circuitry to the phase detector circuit, and said phase detector circuit being responsive to the difference in phase detected between the clock signals transferred through the first and second delay lines and varying the delay of one of the delay lines to bring the clock signals transferred through the first and second delay lines into exact phase with one another.

2. A digital phase lock loop circuit as claimed in claim 1 in which the phase detector circuit comprises means for varying the delay through the second delay line.

3. A digital phase lock loop circuit as claimed in claim 2 in which the means for varying the delay through the second delay line comprises means for selecting a particular stage of the second delay line.

4. A digital phase lock loop circuit as claimed in claim 3 in which the means for selecting a particular stage of the second delay line comprises a multiplexor arranged to transfer signals from different stages of the second delay line based on the difference in the phase detected between the clock signals transferred through the first and second delay lines.

5. A digital phase lock loop circuit as claimed in claim 4 in which the phase detector circuit includes a counter arranged to respond to the difference in phase detected to cause the multiplexor to select a stage of the second delay line.

6. A digital phase lock loop circuit as claimed in claim 3 in which the second delay line is comprised of a plurality of inverter stages, and means for selecting one of such stages.

7. A digital phase lock loop circuit as claimed in claim 3 which further comprises means for deriving a clock signal which may be sent to associated circuitry.

8. A digital phase lock loop circuit as claimed in claim 2 in which the first delay line is a fixed delay line arranged on the same circuit board as the remainder of the digital phase lock loop circuit.

9. A digital phase lock loop circuit as claimed in claim 2 in which the first delay line is a fixed delay line arranged on a circuit board apart from the remainder of the digital phase lock loop circuit.

* * * * *